United States Patent [19]

Shahid

[11] Patent Number: 5,639,387

[45] Date of Patent: Jun. 17, 1997

[54] METHOD FOR ETCHING CRYSTALLINE BODIES

[75] Inventor: Muhammed Afzal Shahid, Ewing Township, Mercer County, N.J.

[73] Assignee: Lucent Technologies Inc., Murray Hill, N.J.

[21] Appl. No.: 408,800

[22] Filed: Mar. 23, 1995

[51] Int. Cl.[6] .................................................. H01L 21/302
[52] U.S. Cl. .................. 216/39; 156/625.1; 156/647.1; 156/662.1; 216/24; 216/83; 216/99
[58] Field of Search ........................... 156/625.1, 643.1, 156/646.1, 647.1, 662.1; 216/58, 39, 65–67, 83, 96, 99, 24

[56] References Cited

U.S. PATENT DOCUMENTS

| | | | |
|---|---|---|---|
| 4,439,268 | 3/1984 | Coldren et al. | 156/647.1 |
| 4,470,875 | 9/1984 | Poteat | 156/647.1 |
| 4,737,470 | 4/1988 | Bean | 156/647.1 |

OTHER PUBLICATIONS

T.O. Townley, "Optimum Crystallographic Orientation for Silicon Device Fabrication," *Solid State Technology*, Jan. 1973, pp. 43–47.

*Primary Examiner*—T. Tung

[57] ABSTRACT

A set of features, such as a pattern of V-grooves (20—20), can be precisely etched in a wafer (18) by patterning the V-grooves so that their axis of symmetry has a prescribed relationship with the axis of tilt (27) of the wafer surface (22).

12 Claims, 1 Drawing Sheet

METHOD FOR ETCHING CRYSTALLINE BODIES

TECHNICAL FIELD

This invention relates to a technique for etching a crystalline body, such as a silicon wafer, to produce precision features therein.

BACKGROUND ART

Monocrystalline silicon is a basic building block for optical fiber devices such as optical fiber plugs, laser array modules and switch modules. Such optical fiber devices are typically fabricated by etching a wafer of monocrystalline silicon to establish one or more V-grooves, each V-groove being dimensioned to seat an individual optical fiber. The wafer is then sectioned to create a plurality of a submounts, each mounting a plurality of fibers in a set of V-grooves for alignment with those held by another such submount.

The V-grooves in a silicon submount are usually created by anisotropically etching the monocrystalline wafer whereby the wafer etches faster in certain crystallographic directions than in others. By selecting the appropriate wafer orientation and by selecting the mask pattern, features, such as V grooves, squares or pits, can be formed in a major surface of the wafer very precisely. In the case of V-grooves etched into a silicon submount, high precision is crucial. In some instances, the symmetry of the V-grooves (i.e., the orientation and lateral spacing of each V-groove from a reference point on the upper surface of the submount) must be better than 0.5 μm.

In practice, silicon wafers of the type used in the microelectronics industry are diced from a single crystal ingot such that each wafer has its upper surface slightly tilted (typically about 3°) from the wafer's vicinal or true (100) crystal plane along either the [011] or [0$\bar{1}$1] direction after polishing. Typically, the wafer surface is titled with respect to the true (100) plane to facilitate wafer oxidation and other surface deposition steps performed during processing of the wafer, for example, to provide at least one masking layer over the monocrystalline silicon.

During processing, a reference flat is ground into each wafer parallel to the <110> direction. Although all wafer manufacturers grind a flat in each wafer, there is no standard regarding the orientation of the flat. For different manufacturers, the flat may be oriented differently. Thus, it is not possible to determine the orientation of the wafer, and more particularly, the orientation of the tilt axis, simply by reference to the location of the flat.

In order to produce V-groove features in a silicon wafer, the wafer is coated with a thin (e.g., ~1 μm thick) layer of a first masking material on both of its major surfaces. The first masking layers may be fabricated from silicon dioxide or silicon nitride for example. After the first masking layer has been applied, then a conventional photoresist mask is applied, thus forming a second masking layer over the silicon. Conventional photolithographic techniques are utilized to create a pattern of windows in the photoresist. The photoresist is etched along with the first masking layer to expose the silicon wafer through the pattern of windows. A first masking layer fabricated from silicon dioxide may be etched with a buffered hydrofluoric acid solution. Once the photoresist and first masking layer have been etched, the photoresist is stripped from the wafer, and then the wafer is anisotropically etched with a ethylene diamine procatechol solution to create the desired V-grooves through the windows in the first masking layer. Lastly, the first masking layer is stripped, and the wafer is sectioned into individual submounts. The silicon exposed through the windows in the first masking layer is typically anisotropically etched to create the desired features (i.e., the V-grooves) that lie in the wafer vicinal (100) crystal plane. When V-grooves are etched parallel to the <110> direction, the planar facets bounding the V-grooves lie within {111} planes that are inclined with respect to the (100) plane at an angle of 54.7°.

Often, the desired precision of the etched V-grooves is not obtained, requiring that the wafers be screened, adding to production costs. Thus, there is a need for a technique that improves the positional accuracy of features etched in a crystalline body.

BRIEF SUMMARY OF THE INVENTION

Briefly, in accordance with a preferred embodiment of the invention, a method is provided for creating precision features through a mask layer overlying a major surface of a crystalline body, such as a monocrystalline silicon, Ge, GaAs, InP, CdTe and other materials that crystallize in a zinc-blende or a diamond cubic structure. The method is initiated by first determining the crystallographic orientation of the major surface of the body relative to its vicinal {100} plane. In practice, the major surface of most crystalline wafers is tilted by a small amount about an axis that is parallel to one of the two directions [011] and [0$\bar{1}$1]. Thus, the first step of the instant method is to determine the orientation of the tilt axis of the crystalline body. Once the tilt axis orientation has been established, then a first masking layer overlying the major surface of the body is masked to lay out at least one pattern of features whose symmetry has a prescribed relationship with the tilt axis, depending on whether symmetry or asymmetry of the features is desired. After the first masking layer on the crystalline body has been masked, then the first masking layer is etched to create the features in the crystalline body itself. By patterning the first masking layer overlying the surface of the crystalline body so the features are symmetrical about an axis having a prescribed relationship with the tilt axis, the features etched in the crystalline body can be controlled more precisely than if the features were patterned without regard to the orientation of the tilt axis.

DETAILED DESCRIPTION

Figure 1:
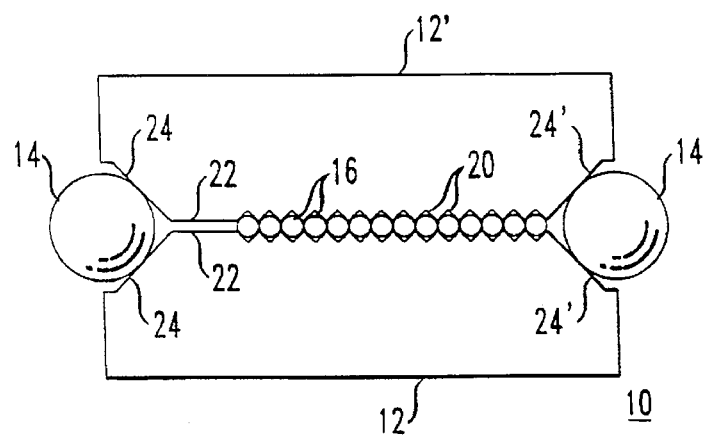
FIG. 1 is a side view in cross-section of an optical assembly according to the prior art.

FIG. 1 is a side view, in cross section, of a prior-art optical fiber assembly 10 comprised of a pair of opposed submounts 12—12' that are maintained in alignment with each other by a pair of pins 14—14'. When held in alignment by the pins 14—14', the submounts 12–12' hold a plurality of optical fibers 16—16 in precise spaced alignment with each other. Each of the submounts 12–12' is fabricated by etching a crystalline body 18 (see FIG. 2), typically a monocrystalline silicon wafer, to fabricate a plurality of V-grooves 20—20 in a first major surface 22, together with a pair of sloping reference walls 24–24' on opposite sides of the grooves. Typically, the wafer 18 of FIG. 2 yields a plurality of submounts 12–12'. The reference walls 24–24' serve to contact the alignment pins 14–14', respectively, when the submounts are opposed to each other as shown in FIG. 1.

To assure proper fiber alignment, each V-groove 20 must be parallel to, and spaced a prescribed distance from, each of the reference walls 24–21'. Further, both the reference walls 24–24' as well as the V-grooves 20—20 should be aligned parallel to the <110> direction. Even a small variation in spacing can be critical. For example, consider when the V-grooves 20—20 in the upper submount 12' are mis-aligned relative to one or both of the reference walls 24–24' as indicated in phantom in FIG. 1. Thus, when the submount 12' is positioned opposite the submount 12 so that the V-grooves 20—20 in each submount lie in aligned registration with those in the other, one or both of the reference walls 24–24' of the upper submount may not contact a corresponding one of the pins 14–14', respectively. As a consequence, the fibers 16—16 in the optical assembly 10 may not be precisely aligned with those of another assembly aligned by the same pins 14–14'.

Figure 2:
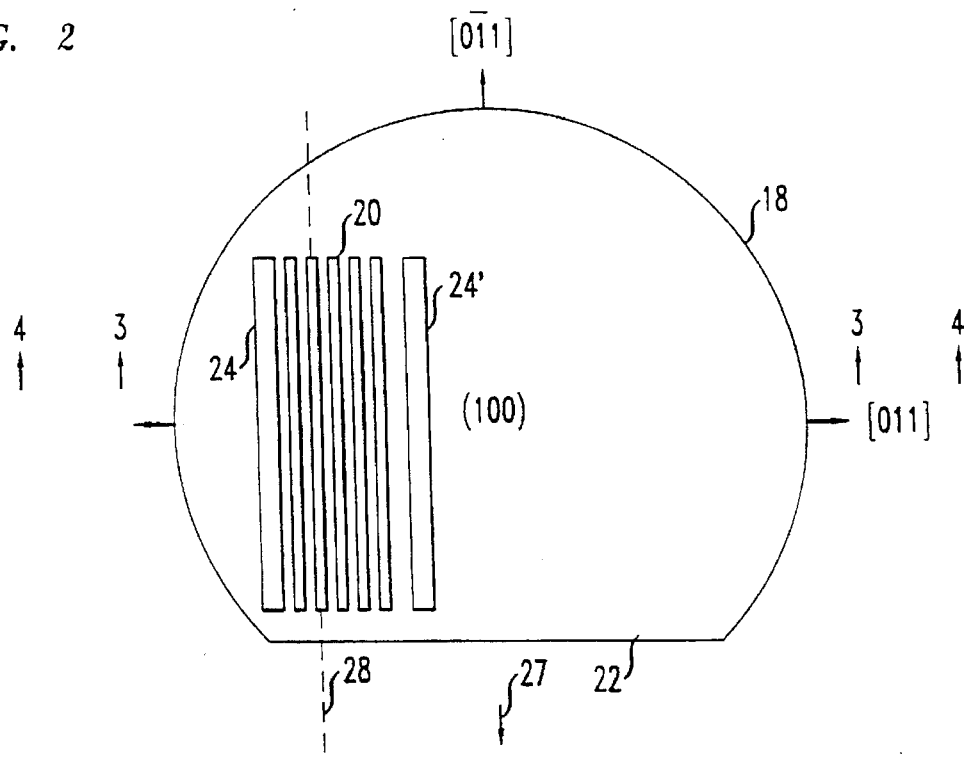
FIG. 2 is a plan view of a silicon wafer having a set of grooves etched therein to create the portions of the assembly of FIG. 1.
Figure 3:
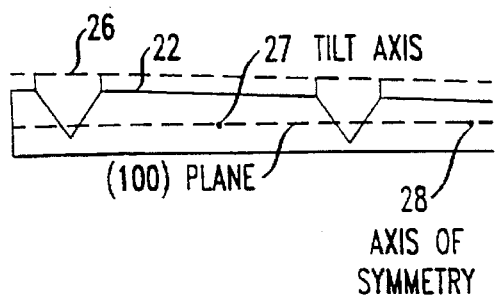
FIG. 3 is a cross sectional view of a submount, comprising a portion of the wafer of FIG. 2, taken along a plane 3—3 thereof, showing the grooves when the axis of symmetry of the grooves is parallel to the tilt axis of the wafer surface.

FIG. 3 depicts a submount, such as the submount 12 of FIG. 1, which comprises a portion of the wafer 18 of FIG. 2 in which the V-grooves 20—20 and the reference walls 24–24' are anisotropically etched through a mask layer 26 (shown in phantom in FIGS. 3 and 4) that overlies a major surface 22 of the wafer. In practice, the wafer 18 of FIG. 2 is diced from a single crystal ingot (not shown) such that the wafer surface 22 is tilted about a tilt axis 27 by a small amount (approximately 3°) from the wafer's true or vicinal {100} plane as indicated in FIG. 3. Referring to FIG. 3, the tilt axis 27 is depicted as being aligned with the [0$\bar{1}$1] direction although it could be aligned with the [011] direction.

I have discovered that the orientation (i.e., the lateral symmetry) of the V-grooves 20—20 relative to the tilt axis 27 of the wafer 18 significantly affects the ability of the optical assembly 10 (see FIG. 1) to accurately maintain each fiber 16 in alignment with a corresponding fiber held by another assembly. To appreciate how the alignment accuracy may be affected, assume that the wafer surface 22 (see FIG. 2) has its tilt axis 27 lying along the [0$\bar{1}$1] direction and that the V-grooves 20—20 have an axis of symmetry 28 aligned with the tilt axis 27. Referring to FIG. 3, when the V-grooves 20 are oriented with their symmetry axis 28 parallel to the tilt axis 27, then V-grooves will be mis-oriented relative to the submount's physical surface (lying immediately below the masking layer 26 shown in phantom). This mis-orientation may lead to misalignment of one or more of the optical fibers 16 (see FIG. 1) held by the assembly 10 of FIG. 1 relative to a corresponding fiber held by another assembly.

Figure 4:
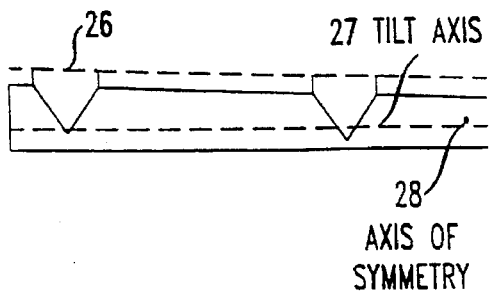
FIG. 4 is a cross-sectional view of another submount, comprising a portion of the wafer of FIG. 2 along a plane 4—4 thereof, showing the grooves in the wafer surface when axis of symmetry of the grooves is perpendicular to the axis of tilt of the wafer surface.

As discussed, the tilt axis may lie along the [011] as seen in FIG. 4 rather than the [0$\bar{1}$1] direction as seen in FIG. 3. Thus, as seen in FIG. 4, when the tilt axis 27 lies along the [011] direction, then the V-grooves 20—20 have their axis of symmetry 28 perpendicular to the tilt axis. Under this condition, the V-grooves 20—20 are not mis-oriented with respect to the submount's physical surface as compared to the mis-orientation shown in FIG. 3.

Therefore, in accordance with the invention, precision features may be etched in a crystalline body, such as the silicon wafer 18 of FIG. 2, by first determining the orientation of the wafer surface 22 relative to the wafer's vicinal {100} plane. In other words, the orientation of the tilt axis 27 relative to the directions [011] and [0$\bar{1}$1] must be established. After the orientation of the tilt axis 27 has been established relative to the [011] and [0$\bar{1}$1] directions, then the masking layer 26 above the surface 22 is masked to lay out at least one pattern of features so that their axis of symmetry 28 is perpendicular to the tilt axis 27. In other words, the wafer 18 of FIG. 2 is masked so that V-grooves 20—20 and the reference walls 24–24' are laid out with their longitudinal axis perpendicular to the tilt axis 27. Thus, if the tilt axis 27 were found to line along the [011] direction as seen in FIG. 2, then the V-grooves 20—20 and the reference walls 24–24', all of FIG. 2, would have their longitudinal axis lying along the [0$\bar{1}$1] direction. Once the wafer 18 has been masked in this manner, then the wafer is etched anisotropically to form the desired pattern of features (i.e., the V-grooves 20—20 and the reference walls 24—24'). Such etching may be carried out in a known fashion.

There are a variety of techniques for establishing the crystallographic orientation of the wafer 18. One technique is discussed in the paper "Optimum Crystallographic Orientation For Silicon Device Fabrication", by D. Townley, *Solid State Technology*, January 1973 (pages 43–47) (herein incorporated by reference). To detect the crystallographic orientation, visible light is directed at a wafer. The radiation is reflected back from etch pits to produce a set of lobes that have a prescribed size relationship with each other depending on the crystallographic orientation of the wafer. By comparing the size of the radiation lobes, the crystallographic orientation of the wafer can be established. The crystal orientation can also be established by the Laue method using x-rays, as discussed in chapter 8 of the text *Elements of X-ray Diffraction*, by B. D. Cullity (Addison Wesley, 1956) (herein incorporated by reference).

Although it is normally desirable to mask the masking layer 26 so that the features (i.e., V-grooves 20—20 and the reference walls 24-24') have their axis of symmetry 28 perpendicular to the tilt axis 27, there may be situations when it is desirable to have the V-grooves intentionally mis-oriented as seen in FIG. 3. Under such circumstances, the V-grooves 20—20, or such other features, may be intentionally mis-oriented by masking the mask layer 26 so that the axis of symmetry 28 of the features is parallel to the tilt axis 27. In this way, the V-grooves 20—20, or such other features, can be reliably shifted with respect to the wafer's vicinal {100} plane between the reference walls 24–24'. The important factor is to know the orientation of the tilt axis 27 in advance of masking so that the desired symmetry or asymmetry of the features (i.e., the V-grooves 20—20)can be achieved.

The foregoing describes a technique for precisely creating features (i.e., V-grooves 20—20) in a wafer (18).

It is to be understood that the above-described embodiments are merely illustrative of the principles of the invention. Various modifications and changes may be made thereto by those skilled in the art which will embody the principles of the invention and fall within the spirit and scope thereof. For example, although the wafer surface as been described as lying along the (100) plane, the surface could lie along another plane, such as the {111} plane. Although the invention has been described with respect to monocrystalline silicon, it is readily applicable to Ge, GaAs, InP, CdTe and other crystalline materials.

What is claimed is:

1. A method for producing precision features in a major surface of a crystalline body, the surface being tilted about an axis relative to a vicinal plane of the body, the method comprising the steps of:

establishing an orientation for the axis of tilt of the major surface of the crystalline body relative to the body's vicinal crystal plane;

masking the major surface of the body to lay out at least one pattern of features having a prescribed symmetry about a second axis that is one of perpendicular and parallel to the axis of tilt; and etching the body to form the features in the surface.

2. The method according to claim 1, wherein the pattern of features comprises a pattern of V-grooves.

3. The method according to claim 1, wherein the pattern of features includes a pair of reference walls, each lying on opposite sides of a pattern of V-grooves.

4. The method according to claim 3, wherein the body has its vicinal plane lying in a {100} plane and wherein the axis of tilt lies along a <0$\bar{1}$1> direction.

5. The method according to claim 4, wherein the V-grooves and reference walls are aligned parallel to the axis of tilt.

6. The method according to claim 5, wherein each of the V-grooves and the reference walls is asymmetric.

7. The method according to claim 4, wherein the V-grooves and reference walls are aligned perpendicular to the axis of tilt.

8. The method according to claim 7, wherein, each of the V-grooves and the reference walls is symmetric.

9. The method according to claim 3, wherein the body has its vicinal plane lying along a {100} plane and wherein the axis of tilt lies along a <1 10> direction.

10. The method according to claim 1, wherein the body is etched anisotropically.

11. The method according to claim 1 wherein the prescribed symmetry is symmetric when the second axis is perpendicular to the axis of tilt.

12. The method according to claim 1, wherein the prescribed symmetry is asymmetric when the second axis is parallel to the axis of tilt.

* * * * *